(12) United States Patent
Bartz et al.

(10) Patent No.: US 6,701,508 B1
(45) Date of Patent: Mar. 2, 2004

(54) METHOD AND SYSTEM FOR USING A GRAPHICS USER INTERFACE FOR PROGRAMMING AN ELECTRONIC DEVICE

(75) Inventors: Manfred Bartz, Snohomish, WA (US); Marat Zhaksilikov, Snohomish, WA (US); Douglas H. Anderson, Edmund, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 13 days.

(21) Appl. No.: 09/989,574

(22) Filed: Nov. 19, 2001

(51) Int. Cl.[7] .............................................. G06F 17/50
(52) U.S. Cl. ............................ 716/11; 716/12; 716/13; 716/14
(58) Field of Search .............................. 716/11, 12, 13, 716/14

(56) References Cited

U.S. PATENT DOCUMENTS

| | | | | |
|---|---|---|---|---|
| 5,220,512 A | * | 6/1993 | Watkins et al. ................ | 716/11 |
| 5,544,067 A | * | 8/1996 | Rostoker et al. .............. | 703/14 |
| 5,619,430 A | * | 4/1997 | Nolan et al. ................... | 702/63 |
| 5,887,189 A | * | 3/1999 | Birns et al. .................... | 712/32 |
| 6,057,705 A | * | 5/2000 | Wojewoda et al. ........... | 326/38 |
| 6,321,369 B1 | * | 11/2001 | Heile et al. .................... | 716/11 |
| 6,535,061 B2 | * | 3/2003 | Darmawaskita et al. .... | 330/254 |
| 6,542,844 B1 | * | 4/2003 | Hanna ........................ | 702/120 |
| 6,563,391 B1 | * | 5/2003 | Mar ............................ | 331/116 |
| 2001/0021985 A1 | * | 9/2001 | Aldridge et al. .............. | 714/38 |

* cited by examiner

*Primary Examiner*—Matthew Smith
*Assistant Examiner*—Andrea Liu
(74) *Attorney, Agent, or Firm*—Wagner, Murabito, & Hao LLP (57) ABSTRACT

A method and a system for using a graphics user interface for programming a microcontroller. The microcontroller design system includes a device editor system with integrated datasheet information and having three independent, but integrated workspaces to provide a programmer an organized way of displaying device editor information. The three workspaces include a user module selection workspace, a user module placement workspace and a user module pin out workspace for allowing the programmer to select desired function components for a target microcontroller device. The user module selection workspace allows the programmer to select desired components from a list of user modules and the placement workspace allows user modules to be placed in allowable hardware resources. The user module pin out workspace provides the programmer with the means to retrieve pin out information on the selected user modules that constitute the desired target microcontroller device design.

39 Claims, 10 Drawing Sheets

METHOD AND SYSTEM FOR USING A GRAPHICS USER INTERFACE FOR PROGRAMMING AN ELECTRONIC DEVICE

CROSS REFERENCE TO RELATED APPLICATION

This application is related to Bartz, et al., co-filed U.S. patent application Ser. No.: 09/989,815, filed on Nov. 19, 2001, entitled "A DATA DRIVEN METHOD AND SYSTEM FOR MONITORING HARDWARE RESOURCE USAGE FOR PROGRAMMING AN ELECTRONIC DEVICE". This application is also related to Warren Snyder ("Snyder"), U.S. patent application Ser. No.: 10/033,027, entitled "MICROPROCESSING PROGRAMMABLE SYSTEM ON A CHIP", filed on Oct. 22, 2001, To the extent not repeated herein, the contents of Snyder and Bartz, et al., are incorporated herein by reference.

FIELD OF THE INVENTION

The present claimed invention relates generally to apparatus and method for programming an electronic device. More particularly, the present claimed invention relates to a system and a method of using a graphics applications programming interface in programming the design of a microcontroller.

BACKGROUND ART

Microcontroller devices which utilize nonvolatile memories, such as Electrically Programmable Read Only Memories (EPROMs) are well known in the art. The EPROM or flash memory generally contains the applications software for the microcontroller and must be programmed with data depending upon the particular intended application for the microcontroller. The application software is generally developed using a personal computer. Configuration registers can be programmed from the data loaded into the microcontroller's programmable memory to in turn program hardware resources of the microcontroller.

The data representing this application software, commonly known as a load module, are then transferred to special purpose programming equipment, such as a Data I/O machine. The memory of the microcontroller is then programmed by the special purpose programming equipment usually without employing the processing capabilities of the microcontroller. When such special purpose programming equipment is used, the microcontroller is typically physically placed in the circuit of the programming equipment to accomplish the programming process.

Occasionally, it is necessary to modify the existing contents of the micrococontroller's memory, such as during testing, development, or adjustment of the algorithm executed by the microcontroller. To perform this alteration with conventional microcontroller devices, it is usually necessary to remove the microcontroller from the system in which it is installed and place it in the circuit of the programming equipment.

Another technique that is currently used by microcontroller devices can be referred to as automatic self programming (ASP). ASP requires that the microcontroller containing programmable memory be placed in circuit with a source memory containing data that will be transferred to the microcontroller's memory. When appropriate control signals and programming voltages are applied, the microcontroller transfers data from the source memory to its own memory. Clearly, this technique requires the source memory to be preprogrammed by special purpose programming equipment.

Some microcontroller devices include provisions for programming the microcontroller memory while the unit remains installed in the system. These devices manifest a feature commonly known as run time programming. Run time programming schemes generally provide special circuits that allow user application software to modify the memory contents. This modification or programming, is usually done by invoking a particular subroutine during the normal course of software execution. One disadvantage of run time programming is that it usually requires the user to devote a portion of the microcontroller's available memory space to support the programming function. This memory space is generally used for a software subroutine that serves as an interface between the user's application software and the microcontroller's programming mechanism.

A second disadvantage of the run time programming is that they are not well suited to programming a completely new (un-programmed) microcontroller. Since most run time programming mechanisms are dependent on the above mentioned interface subroutine, they must have the interface subroutine installed by means of special purpose programming equipment before it can be used to program any of the remaining user memory space.

In addition to the drawback described above, the user interface portions of many conventional software applications for programming microcontrollers are very difficult to use. Many of the user interface windows used in the software tend to pop-up as the user is attempting to program the microcontroller. Windows in the design software are popped based on a "flat-organized" drop down menu system with little or cues as to the overall design process. Each window tends to correspond to a discrete function of the microcontroller and many functions may be required to do simple programming tasks. Importantly, the windows give no information as to which ones should be used first and the subsequent order that they should be used in. Also, it was difficult transitioning from one window to another for sharing resources because the programmer could not remember which window contained the source of data required and which window needed the data. Having many windows open on a computer screen can often confuse the programmer as the programmer is unable to keep track of which window represents which function of the microcontroller.

SUMMARY OF INVENTION

Accordingly, to take advantage of applications and the numerous microcontrollers being developed, a microcontroller programming application with extensibility capabilities to allow programmers to dynamically program a microcontroller with datasheets incorporated in the programming software is needed. A need also exists for "out-of-the-box" microcontroller programming system solutions to allow programmers to efficiently organize design components necessary for the complete programming of a microcontroller without unduly tasking the programmer. Specifically, the present invention provides an organized way of displaying a device editor workspace information in an efficient manner.

Embodiments of the present invention are directed to a system and a method for programming microcontrollers in a microcontroller design environment. In general, embodiments of the present invention provide a graphics interface based modularized method of programming for designing features of a programmable microcontroller having programmable hardware resources. In other words, the invention provides the programmer the ability to organize various functional components of the microcontroller with integrated datasheet information readily on the same computer screen by implementing click and drop features of the design software.

Embodiments of the invention include a microcontroller programming software application and system that include a device editor system that allows the programmer to compartmentalize the design of a microcontroller by modularizing the various components that create the desired functionality of the microcontroller using a graphics user interface. The contents of the device editor are presented to the programmer in the form of sub-workspaces which are displayed on the programmer's computer screen. The programmer is then able to navigate through various selection windows and icons to retrieve information on selected predefined and pre-configured user modules of the desired microcontroller components. The workspaces can be presented according to a predetermined sequence to aid the programmers development tasks.

Embodiments of the present invention include user modules that contain pre-configured functions of a target microcontroller device and present the available resources in the design datasheets. The information provided by the user module is typically presented in the form of a window with icons of the available resources that may be selected by the programmer. The user modules once selected, placed and programmed work as peripherals of the target microcontroller.

Embodiments of the present invention also include a user module information presenter. The user module information presenter is presented to the programmer as sub-workspaces as of the overall design environment on the programmer's computer screen. The user module information presenter provides detailed schematic information about a component selected by the programmer for incorporation into the microcontroller. The user module information presented allows the programmer to examine the functional details about a selected component before designing the selected component into the microcontroller.

Embodiments of the present invention also include a resource manager display system. The resource display manager system provides real-time histogram view of the resources being used by the programmer to design the desired microcontroller. The resource display manager enables the programmer to only select enough user modules that the microcontroller has enough resources. If the programmer selects a module that requires more resources than is available, the design software of the present invention will not allow such a selection.

Embodiments of the present invention also include a user selection module. The user selection module provides a catalog of selectable user modules that are available for the programmer to select and a schematic display of a selected user module with a corresponding datasheet information. This sub-workspace allows the designer to select the appropriate user module for a particular function.

Embodiments of the present invention also include a user module placement sub-workspace for providing the programmer a design environment in which to interactively place selected user modules in programmable hardware resources with which to design the desired microcontroller. The user module placement workspace includes a graphical window that illustrates the placement of user modules with respect to the available hardware resources of the microcontroller in a hardware layout graphic display format that is easy to comprehend. The user module placement sub-workspace employs a color coding scheme to relate the user modules placed with their respective schematic placement.

Embodiments of the present invention also include design system blocks that are used by the programmer to place selected user modules to help program the target microcontroller. The design system blocks are analog and digital hardware resource or peripheral blocks of a target microcontroller device that are customized by the placement and configuration of the user modules of the present invention.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments.

On the contrary, the invention is intended to cover alternatives, modifications and equivalents, which may be included within the spirit and scope of the invention as defined by the appended Claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

The invention is directed to a system, an architecture, subsystem and method to program desited functionality into a microcontroller using a graphical user interface with an application program interface based design software with integrated datasheet of components that may be designed into the microcontroller. In accordance with an aspect of the invention, a microcontroller programmer is able to interactively select and incorporate desired electronics components into a target microcontroller from a catalog of available modularized components in a database.

Generally, an aspect of the invention encompasses providing a graphics user interface design platform for selecting and programming the desired functionality of available electronic components into a target microcontroller. The invention can be more fully described with reference to FIGS. 1 through 7.

Figure 1A:
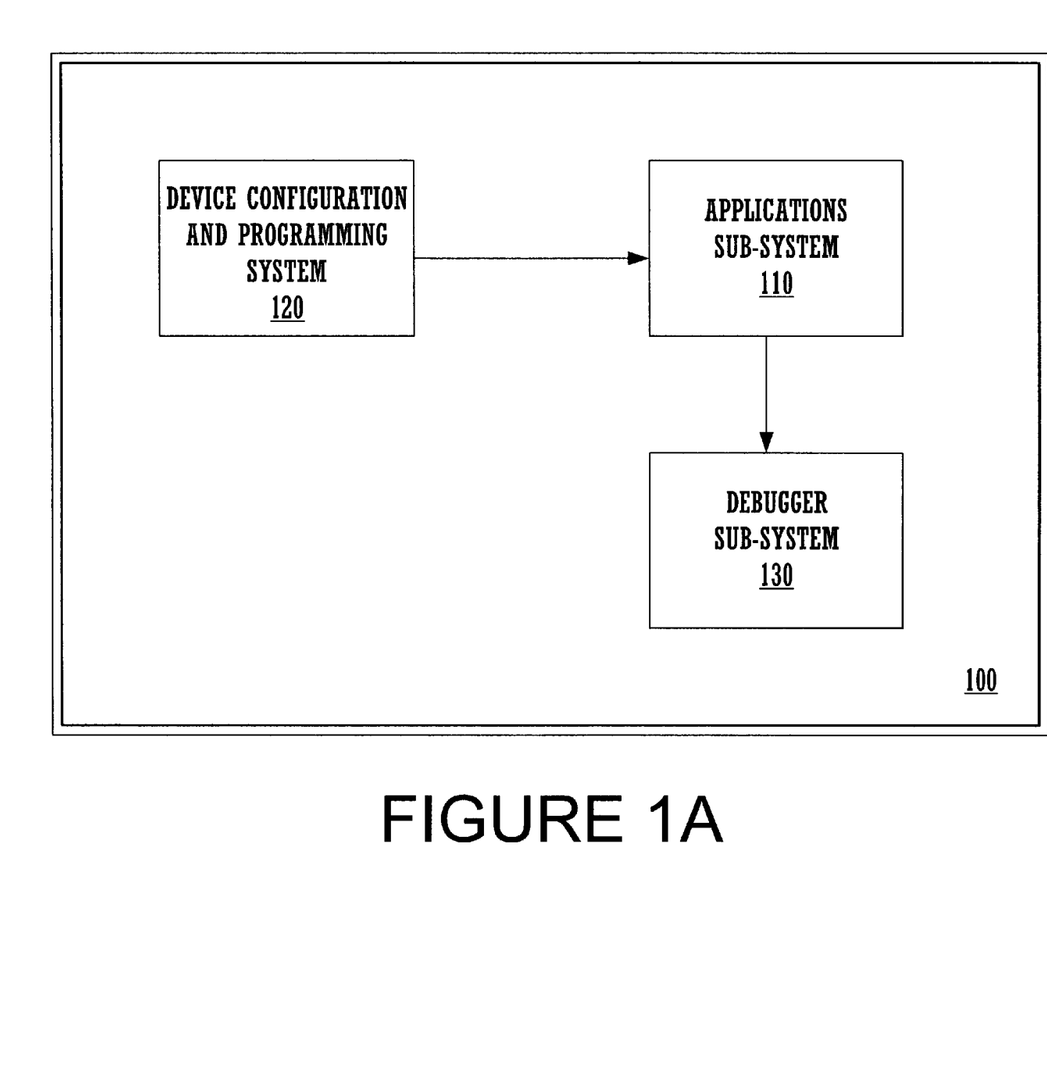
FIG. 1A is a block diagram of the microcontroller design software tool of the present invention.

FIG. 1A is a block diagram illustration of an embodiment of the microcontroller design system 100 (MDS 100) of one embodiment of the present invention. The MDS 100 of the present invention is suitable for programmable single-chip systems and is executed as a software program in memory that is stored in a programmer's computer hard drive. The function of MDS 100 is described in the related US Patent Application entitled "PROGRAMMABLE MICROCONTROLLER ARCHITECTURE," filed on Oct. 22, 2001 by Warren Snyder, attorney docket number CYPR-CD00232, assigned to the assignee of the present invention and hereby incorporated herein by reference. As shown in FIG. 1A, the MDS 100 comprises an application editor sub-system 110, a device configuration and programming sub-system 120 and a debugger sub-system 130.

The device configuration and programming sub-system 120 provides the programmer with an editing platform for the programmer to select and design-in desired components from a database of available pre-configured user modules for a target microcontroller. The device configuration and programming sub-system 120 allows the programmer to select applicable user modules, configure and place these modules in the MDS 100 blocks, make interconnections, set pin outs and track resource usage as the target microcontroller device is programmed. In one embodiment of the present invention, the user module database is integrated with datasheet information of each module in the database. This facilitates user module selection.

To program the desired target microcontroller, the programmer begins by defining a configuration method. In one embodiment of the present invention, the configuration method can be a new configuration or a clone configuration of a pre-existing configuration. The MDS 100 representations of hardware resource includes design blocks that generally comprise analog and digital peripheral blocks of the target microcontroller device that can be customized for placement and configuration, e.g., programmed.

Figure 1B:
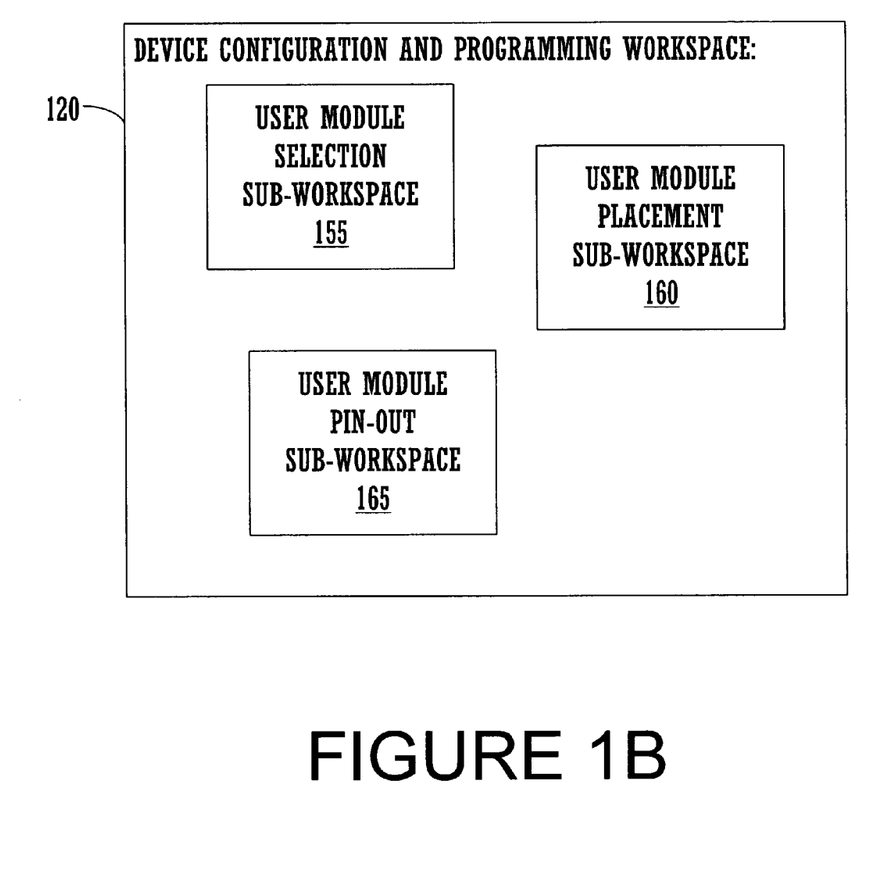
FIG. 1B is a block diagram of an embodiment of the device configuration and programming workspace of the present invention.

FIG. 1B illustrates the sub-workspace of the device configuration and programming workspace 120 in accordance with an embodiment of the present invention. The user module selection sub-workspace 155 is used by the designer to select user modules from a catalog of available user modules. Each user module is a circuit design that can be implemented by one or more hardware resources of the programmable microcontroller. To facilitate the selection of a user module, this sub-workspace 155 presents the types of user modules in multiple series of easy to display catalogued icon groups, with each user module having an icon and a descriptive label. Each group of icons can also have a descriptive label. When a user module is selected in one catalog or listing, an electronic datasheet is automatically displayed to give the designer some detailed information regarding the user module to aid in the selection thereof. Multiple user modules can be selected by the designer. As each one is selected, an associated histogram display illustrates the remaining programmable hardware resources of the microcontroller.

The user module placement sub-workspace 160 is used by the designer to place a selected user module into one or more of the displayed hardware resources. Each hardware resource has an associated graphical display on the computer screen in the sub-workspace 160. Global resource parameters and user module parameter are also shown in graphical user interface windows. Multiple placement iterations can be performed.

The user module pin-out sub-workspace 165 is invoked by the designer in order to establish the proper pin selection and drive type for each pin of the programmable device. The pins can be connected to internal ports of the user module designs from the placement sub-workspace. Therefore, sub-workspaces 155, 160 and 165 of the device configuration and programming workspace 120 allow a chip designer to implement a custom circuit design onto a programmable hardware resource of the microcontroller using pre-configured user modules.

Figure 2:
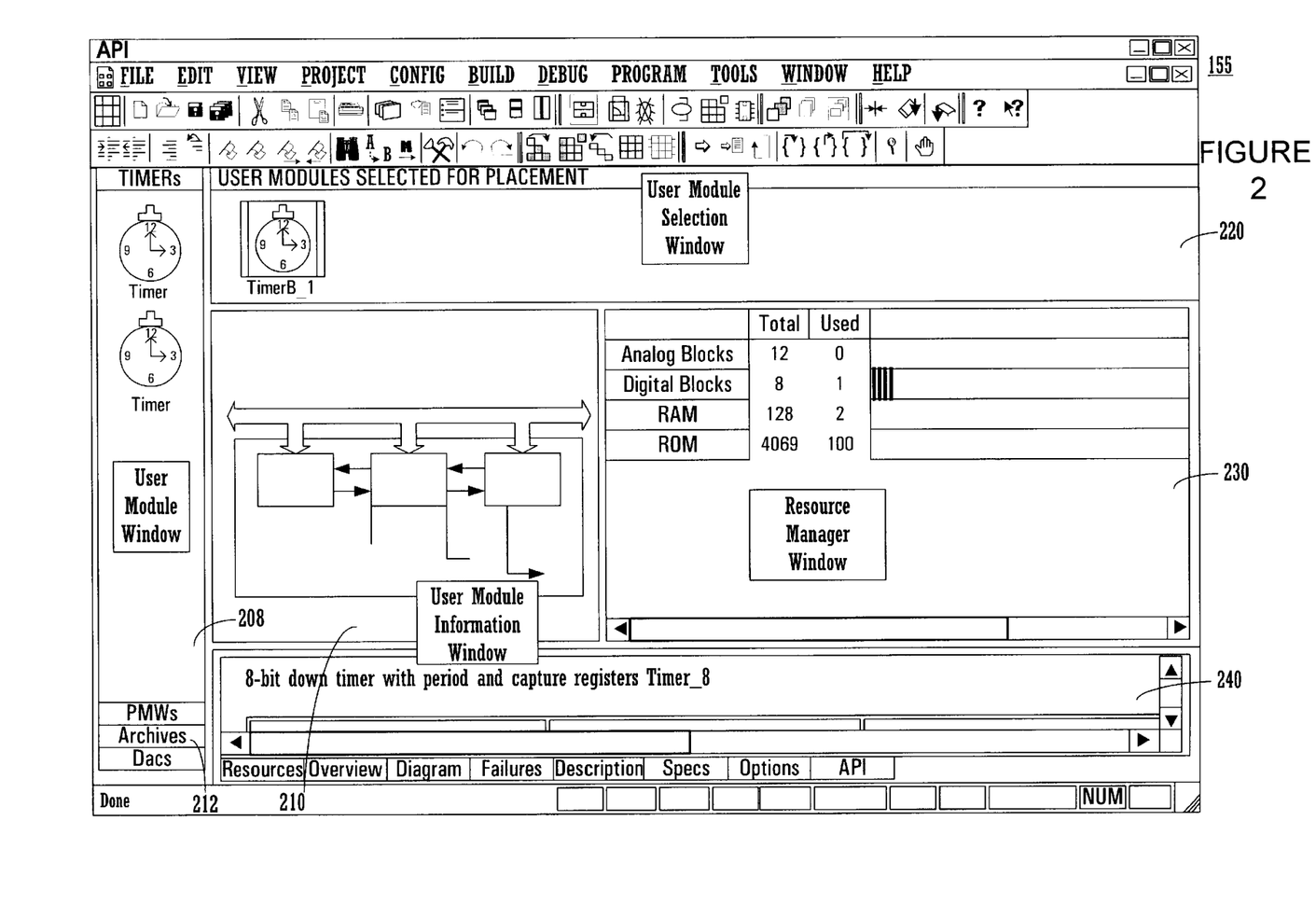
FIG. 2 is an exemplary screen display of the user module selection workspace of the device configuration and programming sub-system of an embodiment of the present invention.

FIG. 2 is an exemplary screen display illustration of one embodiment of the user module selection sub-workspace 155 of the device editor sub-system 120 of the present invention. As shown in FIG. 2, the user module selection sub-workspace 155 comprises, user module catalog workspace 200, user module placement schematic datasheet 210, user module selection work-space 220, resource manager work-space 230 and user module datasheet work-space 240.

The user module work-space 200 provides multiple catalogs of user modules of components available for selection to be designed into the target microcontroller device. In order to access the user modules from the user module work-space 200, the programmer clicks on an icon representations of the desired component or textual representation of the same device to select the desired user module. Tabs 212 with descriptive labels can be used to select between the multiple catalogs of user modules. Ad shown in FIG. 3, the pulse width modulator or PWM catalog is currently selected. Only two user module icons belong to this catalog. Each icon represents a user module and at least four are shown in the Figure. More can be accessed by the scroll bar.

Once the programmer clicks on the desired module, a detailed graphical representation 210 of the selected module is displayed and datasheet information is shown in the user module information work-space 240. From the user module information work-space 240, the programmer is able to view technical pertinent details about the selected module in a desired manner. As histogram 230 is also presented that illustrates the usage of the different types of hardware resources of the microcontroller. As shown, the histogram 230 illustrate remaining digital, analog, ROM and RAM resources based on the selected user modules which appear in the selection box 220. As new use modules are placed into the selection box 220, the histogram 230 automatically updates.

Figure 3:
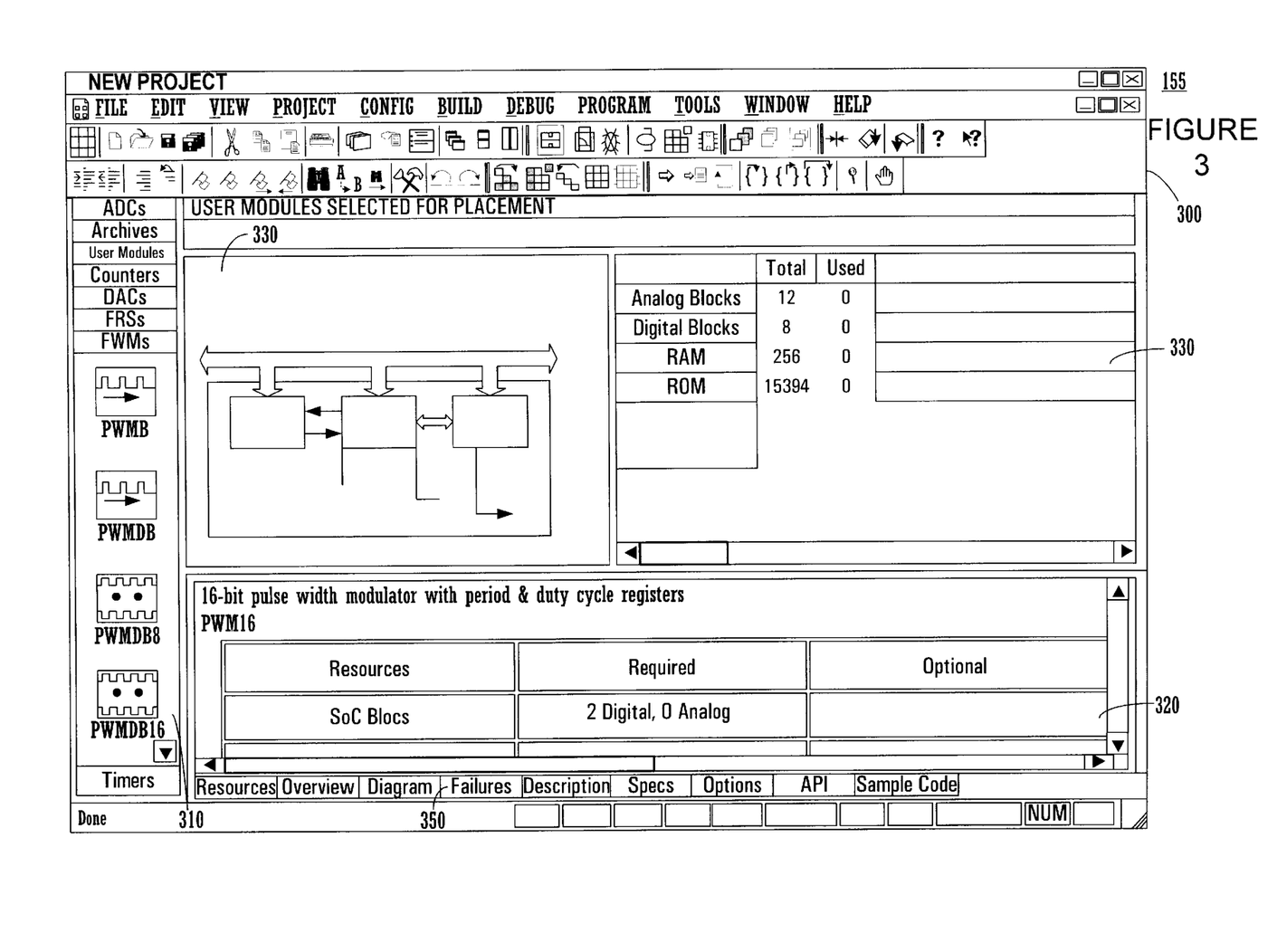
FIG. 3 is a exemplary screen display of the user module selection workspace of the present invention illustrating a displayed datasheet.

FIG. 3 is an exemplary screen sheet 300 of one embodiment of the user module selection work-space 155 of the present invention with no user modules selected. Selecting applicable user modules is the first step in the programming of a target microcontroller device by the programmer. The user modules are accessible pre-configured functions or designs that once the programmer has placed and programmed, work as a peripheral on the target microcontroller device.

As depicted in FIG. 3, the user module selection workspace 155 comprises a catalog of individual modules 310 with related titles to components that the programmer may use to define the target microcontroller device. To access the set of titles in the user selection module work-space 155 (e.g., Timers, Counters, PWMs, etc.) the programmer selects one of the titles and scrolls to see pre-configured options provided in database of the MDS 100.

In the other active windows of the device editor 120, the programmer can view configuration data in display sub-workspace 320 related to an individual user module.

Still referring to FIG. 3, the programmer may click on different tab options in sub-workspace 320 to view additional information regarding a selected user module. Once the programmer has viewed and decided on the desired user modules, the programmer may select the desired modules by choosing the user module from sub-workspace 310. The programmer makes the selection by clicking or double clicking on the desired module which then appears in the upper active work-space 330.

In one embodiment of the present invention, the MDS 100 updates the data in the resource manager work-space 340 for each user module selected and added by the programmer in the design process. The resource manager is updated with the number of occupied hardware resources together with RAM and ROM usage by the current set of selected user modules. The resource manager monitors the resources consumed by selected user modules, particularly memory, in the active work spaces the results are displayed in display 340. If the programmer attempts to select a user module that requires more resources than is available in the MDS 100 database, the MDS 100 will not allow that particular user module to be selected. The resource manager shows cumulatively resources of all user modules selected.

Figure 4:
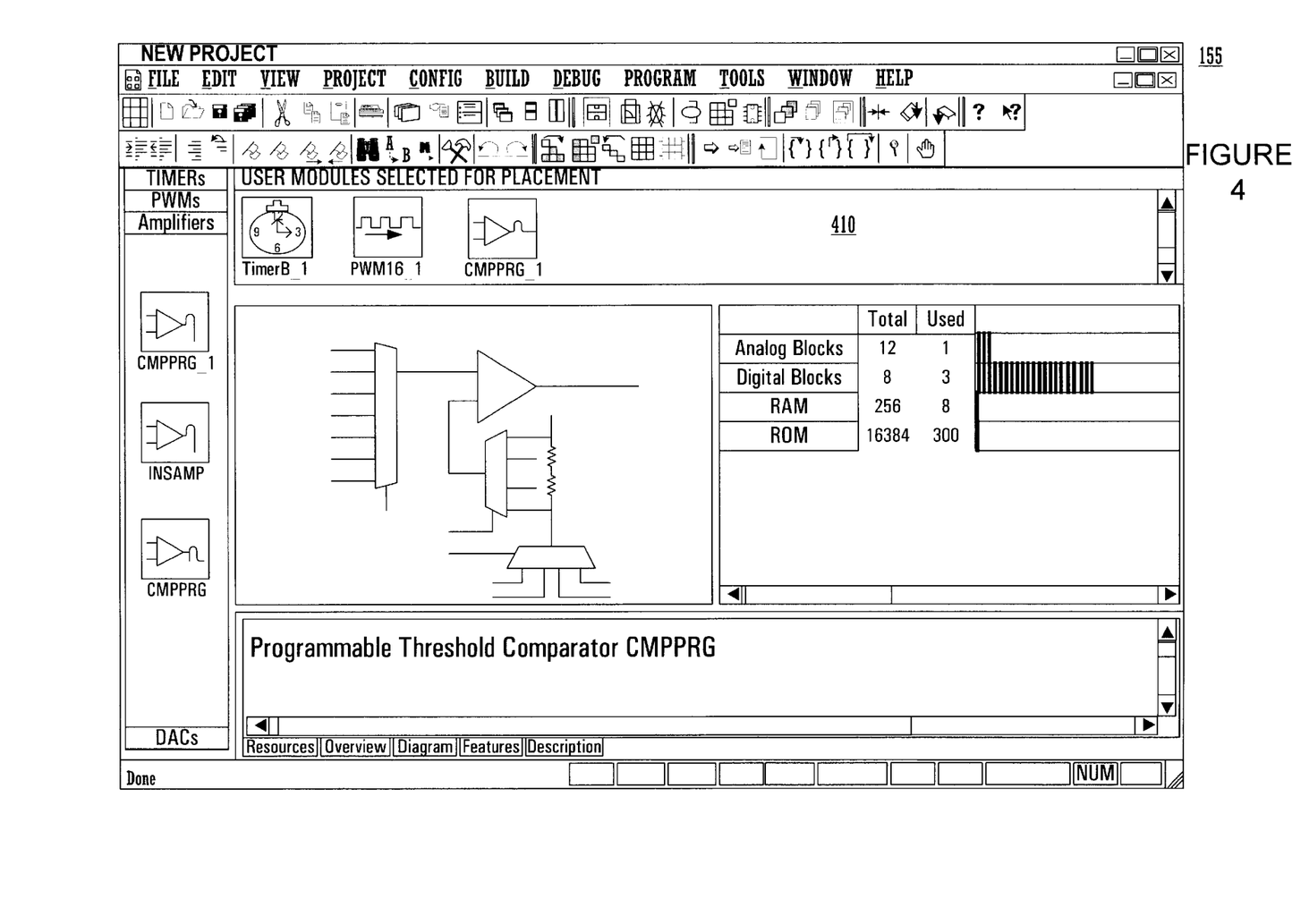
FIG. 4 is a diagram of an exemplary layout of the user module data selection module of the present invention.

After the programmer has highlighted and selected a desired user module, the selected user module is displayed in sub-workspace 410 in the user module selection work-space as shown in FIG. 4. Three user modules are shown, a timer, a PWM and a DAC.

Figure 5:
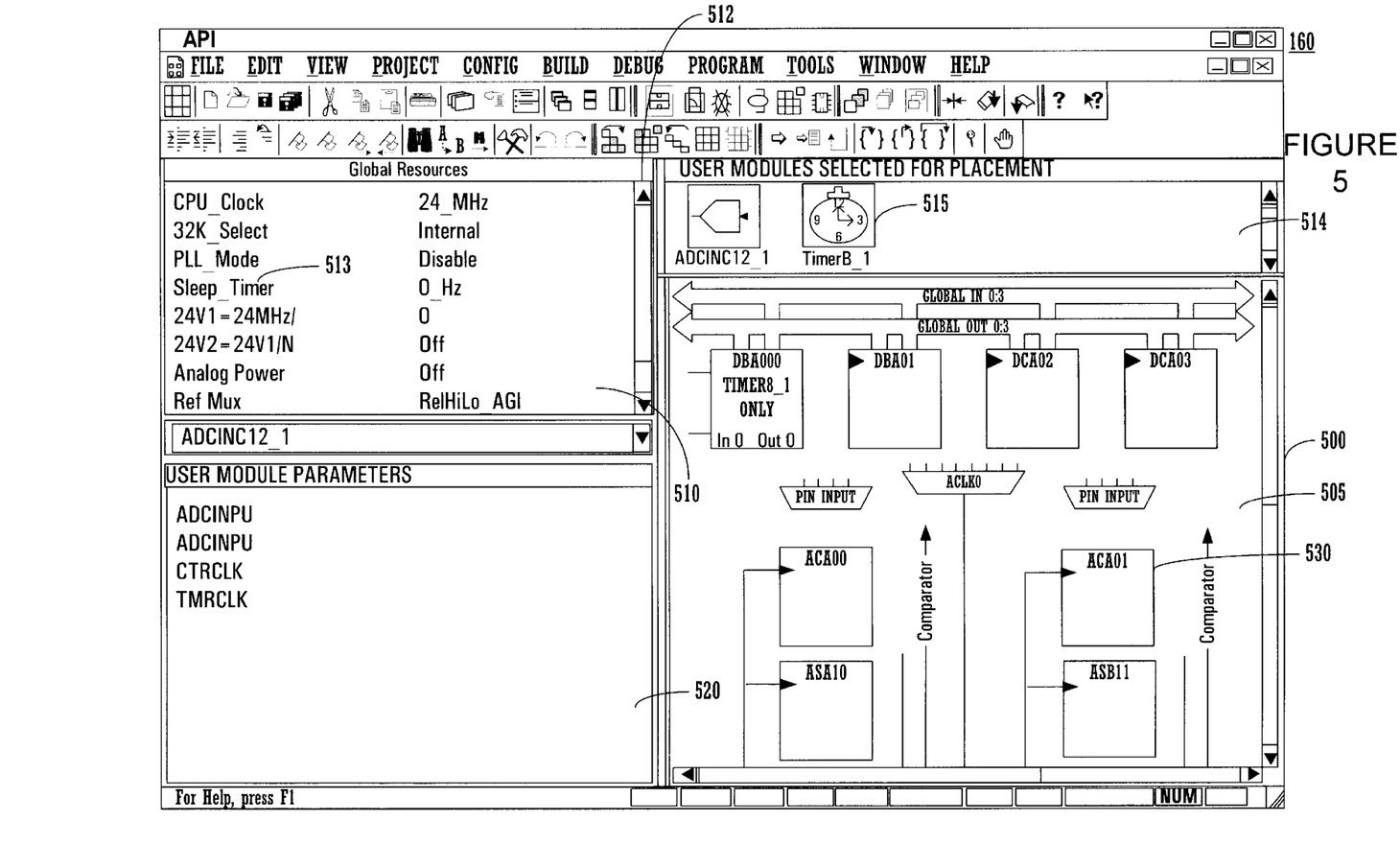
FIG. 5 is a diagram of an exemplary layout of the user module placement module of one embodiment of the present invention.

FIG. 5 is an exemplary screen shot 500 illustration of the placement of user modules after the modules have been selected by the programmer in one embodiment of the present invention. This is the user module placement sub-workspace 160. The user module placement workspace 160 includes a graphic sub-workspace 505 which illustrates the placement of the user module with respect to available resources of the target microcontroller device in a hardware layout graphical display. As shown in FIG. 5, the user module placement sub-workspace 160 comprises a global resource sub-workspace 510, a user module parameters sub-workspace 520 and a user module selected for placement sub-workspace 530. Display 520 allows the user set specified parameters for a selected user module that affects the behavior of the user module. Global parameters are shown and can be edited from display 510.

After the programmer has selected a desired user module, the selected modules can be placed by the user using the user module placement 160. Placing the selected user modules is the second step in the programming of the target microcontroller device. After the programmer has selected the desired user modules, the programmer accesses the place user module icon in the device editor tool bar 515 to place the selected module.

The global resource 510 generates a list of resources of hardware settings that determine the underlying operation of a selected user modules. Such settings include the CPU_ Clock. For example, the settings may designate the speed in which the target microcontroller device processes. In one embodiment of the present invention, a high MHZ setting may indicate fast processing and a low MHZ setting may indicate a slower processing speed.

The global resources 510 may be specified in integer value (such as 24V-1 and 24V-2). The programmer may set these values by clicking on an up-down arrow 512 or by clicking on a selected value and typing over the value 513. The global resource 510 includes a dialog box which specifies when an updated value is out of range.

The user module parameter sub-workspace 520 allows the programmer to view the parameters of selected user modules. To view all the settings of a selected user module, the programmer may click on the module or use a number drop-down list 514 as to the configuration for analog and digital blocks. Once the programmer places a selected module in sub-workspace 540, the parameters are automatically updated with applicable module names.

Sub-workspace 530 depicts an icon representation of selected and placed user modules within the hardware resource. In one embodiment of the present invention, the icons in sub-workspace 530 are color coded to relate selected user modules to their icon representation in sub-workspace 514. In one embodiment of the present invention, if the selected user modules occupy a combination of blocks (both digital and analog) the active blocks are coded in a different color from the inactive blocks. In one embodiment of the present invention, the active blocks are coded in green and the inactive blocks are coded in blue.

The digital resources are represented as blocks in the upper row of display 505. The analog blocks are shown in the lower matrix. When a user module of box 514 is placed, a color is associated between the module's icon of box 514 and the allocated hardware resource or resources of display 505. During placement, the placer process will iteratively illustrate the possible placement options available to the designer for a particular selected user module of box 514. Color coding can also be useful in this process, placement icons can be used to select or drive the iterative placement process. Once placed, descriptive labels can also be associated between the user module icon and its position within the allocated resource block of display 509. Resource block 530 is a vacant analog block.

Figure 6:
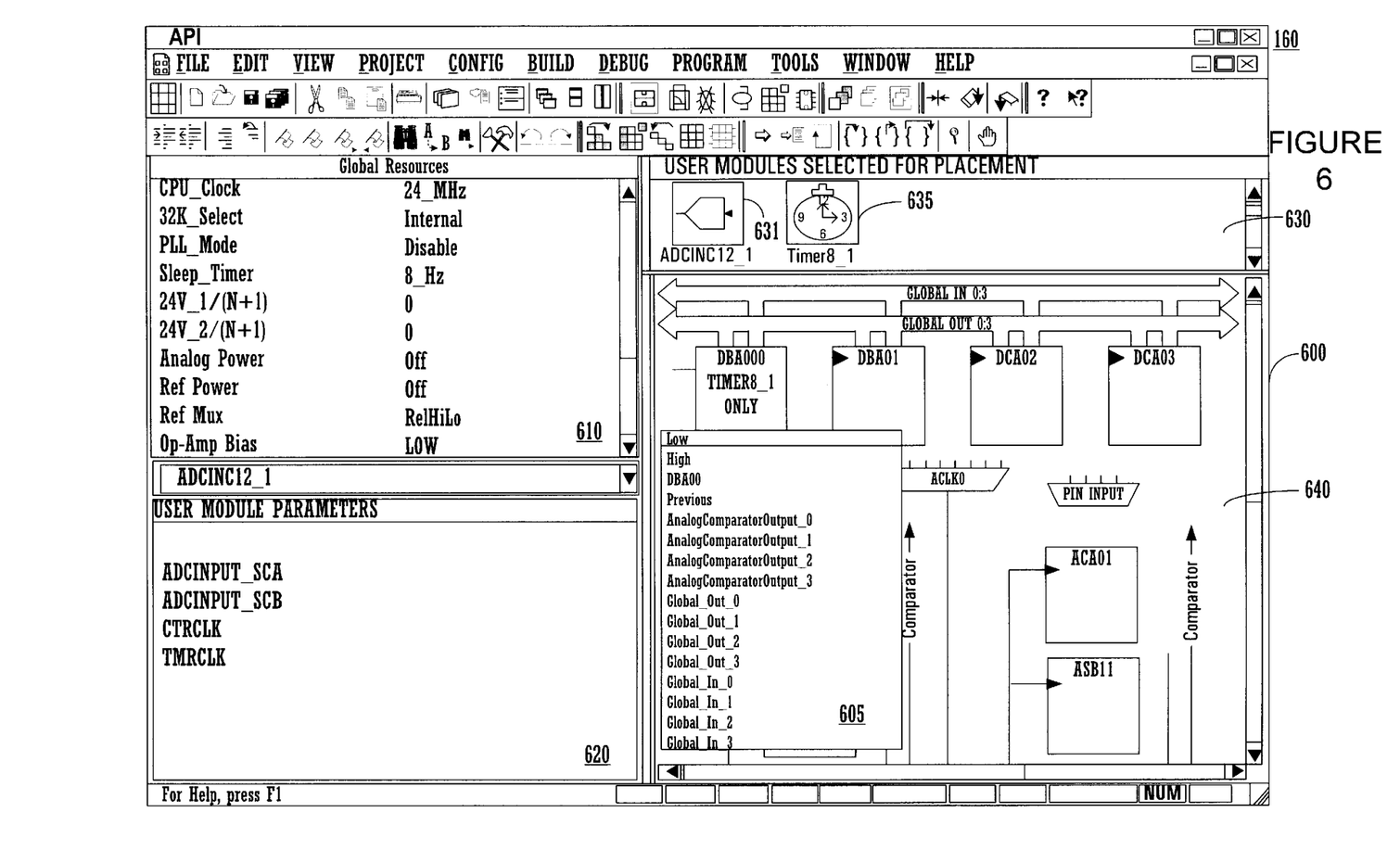
FIG. 6 is a diagram of an exemplary layout of the user module placement parameters module of one embodiment of the present invention.

FIG. 6 is an exemplary screen shot 600 of one embodiment of the user module placement sub-workspace 160 of the present invention. The layout depicted in FIG. 6 comprises global resource sub-workspace 610, the user module parameter sub-workspace 620, selected user module sub-workspace 630 and schematic layout sub-workspace 640.

The user module placement workspace 160 shown in FIG. 6 illustrates the interconnectivity between the selected user modules after they have been selected by the programmer. Interconnectivity between the user modules enables communication between the available modules in the MDS 100 database. Interconnectivity can be accomplished via drop down windows 605 that allows part assignments with interconnection resources of the hardware.

User module interconnections consist of connections to surrounding blocks, output bus, input bus, internal system clocks and references, external pins, and analog output buffers components. In one embodiment of the present invention the user modules available in the MDS 100 database are both analog and digital peripheral blocks of a device that are customized by the placement and configuration of the user modules.

Interconnection can be specified on the target microcontroller device in the user module placement workspace 160. To access the user module placement workspace, the programmer clicks on the place user module icon in the device configuration and programming toolbar. The programmer can then set interconnectivity parameters by left-clicking active areas on the block until a superficial chip appears in the area. The programmer can then click and make valid selections.

Figure 7:
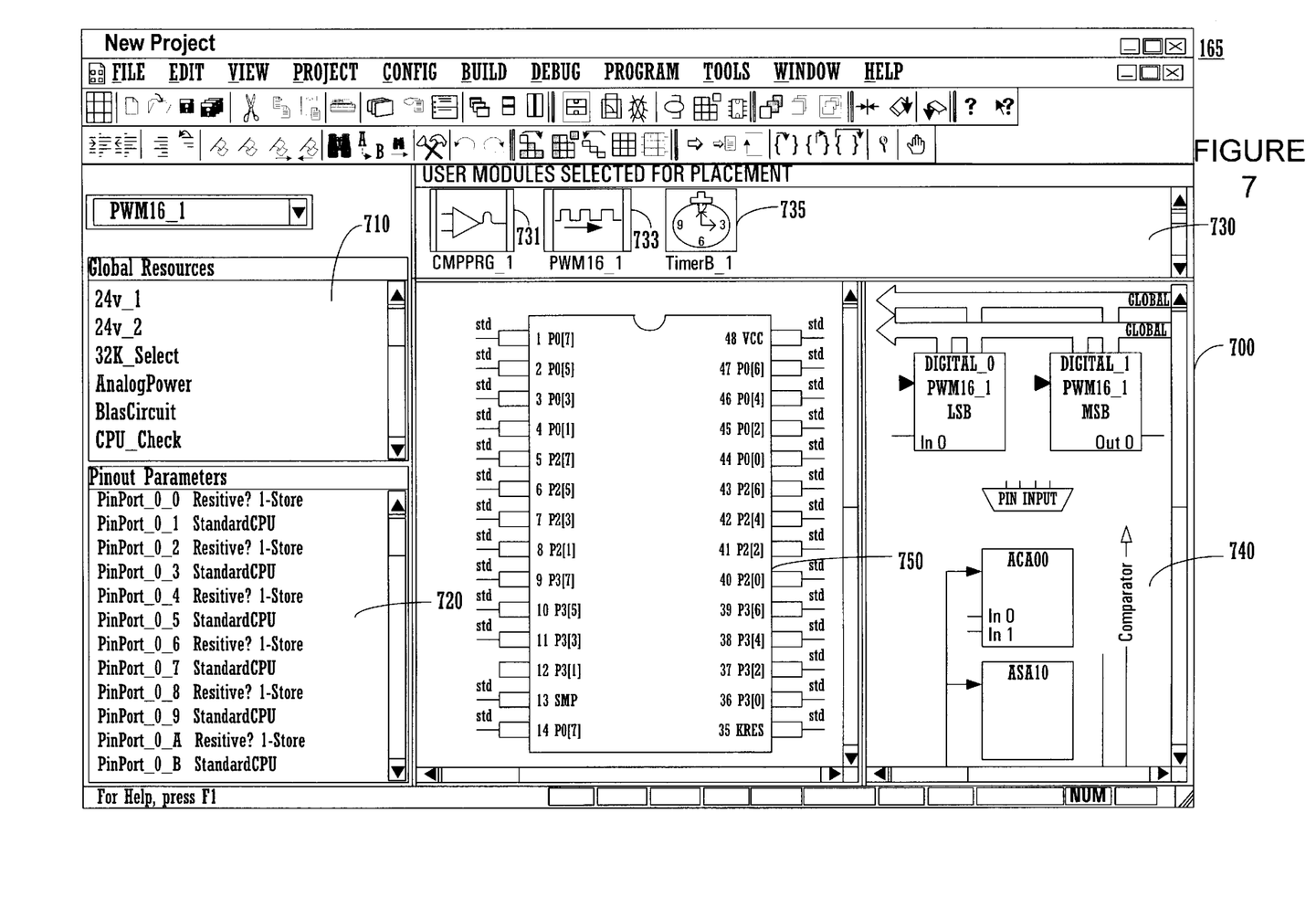
FIG. 7 is a diagram of an exemplary layout of the user module pin out of one embodiment of the present invention.

FIG. 7 is a layout illustration of a pin out specification workspace 700 of one embodiment of the present invention. Specifying the pin out for selected user modules is the last step, in the device configuration and programming subsystem 120 of the present embodiment, to program the target microcontroller device. When specifying a user module block to a pin out, the programmer is making a physical connection between the software configuration and the programming hardware.

FIG. 7 illustrates an exemplary screen shot 700 of the user module pin-out workspace 165. In this sub-workspace 165, the designer can connect internal ports of the system of user modules to external pins. Also, drive type can be specified. The user module selection bar 730 illustrates the used module modules. The global parameters are shown in display 710. The pin-out information can be viewed and edited using a textual or tabular grid display 720 or by interfacing with the graphical display of the external chip 750 which also contains the pin information. Each pin has an associated label. For each pin, a drive selection and a drive type can be selected, either from the graphical display 750 or from the tabular display. Some placement information 740 can also be displayed in the sub-workspace 165. Using the graphical display 750, if the user selects a pin, then a small drop down window appears allowing the user to vary the pin parameters for this pin. Alternatively, the pin can also be selected via the grid 720 whereby a similar drop down window will also appear to allow the user to make the same types of changes.

To specify a pin out, the programmer selects a pin out selection mode from the device configuration and programming sub-system 120 to get into the pin out view mode. Once in the pin out view, the programmer may select a target numbered pin for the selected MDS 100 blocks from sub-workspace 790 and select the applicable port. This selection allows configuration oft he internal global bus connections of the target microcontroller device. In one embodiment of the present invention, the target microcontroller device may consist of any number of pin outs.

After selecting the target numbered pin out, the programmer can select available options for the selected pin out from the pin out parameter sub-workspace 742. This selection allows the configuration of the pin's drive characteristics.

The programmer can repeat the pin out selection and pin out parameters selection until all the active block selected by the programmer (e.g., modules shown in selected user modules placement sub-workspace 720 have a corresponding pin out. As the selections take effect, each pin out is color coded based on the legend beneath the pin out view.

Figure 8A:
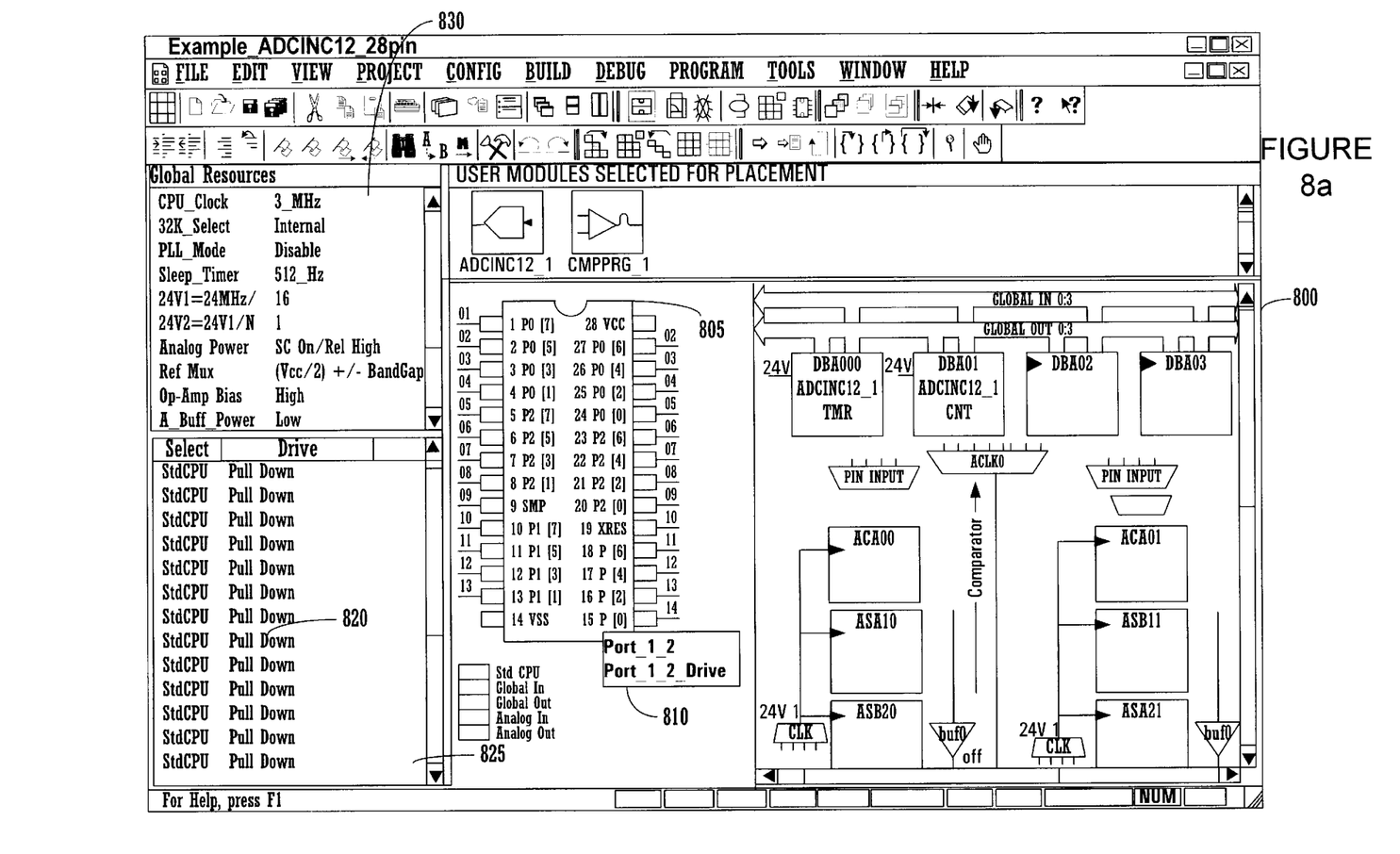
FIG. 8A is a diagram of an exemplary layout of a pin selection of the user module pin out of one embodiment of the present invention.

FIG. 8A illustrates an exemplary screen shot 800 of the user module pin-out workspace 165. In this sub-workspace 165, as described in FIG. 7, the designer can connect internal ports of the system of user modules to external pins. Also, drive type can be specified. As shown in FIG. 8A, when the programmer clicks or double clicks on a selected pin, the programmer is presented with a pull down menu 810. The pull down menu 810 displays the applicable port type and the drive characteristics for the selected pin. The programmer can select the drive type by clicking on the drive type in pull down menu 810. When the programmer clicks on the drive type in pull down menu 810, the programmer is able to pull down the selected drive characteristics from pull down window 820.

Figure 8B:
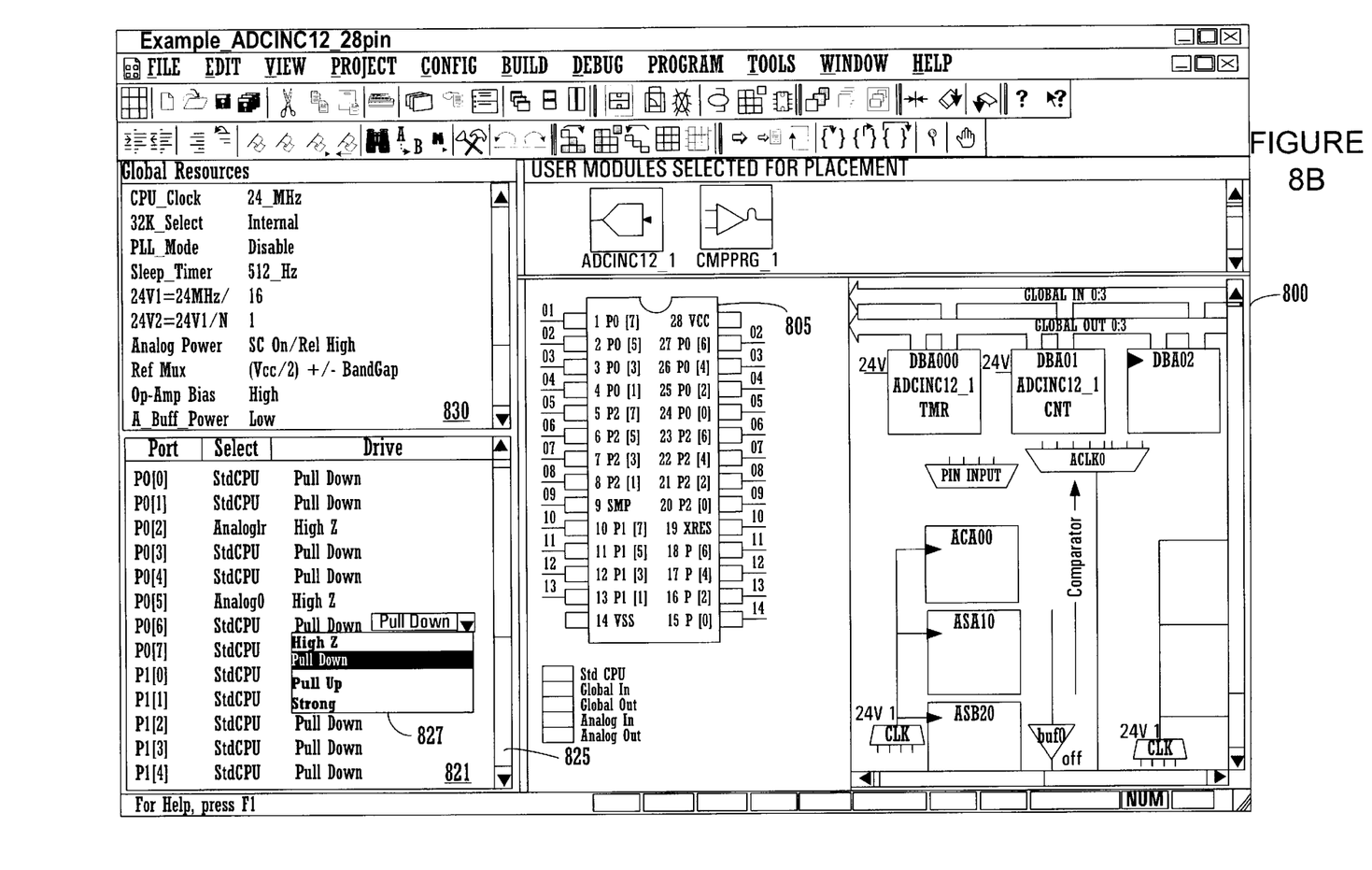
FIG. 8B is a diagram of an exemplary layout of a drive selection of the user module pin out of one embodiment of the present invention.

Alternatively, the drive information can also be selected via the grid 821 in FIG. 8B whereby a similar drop down window 827 will also appear to allow the user to make the same types of changes by scrolling through window 821 using the scroll bar 826.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

What is claimed is:

1. An electronic device configuration system, comprising:
   a device editor sub-system for editing programming of components into an electronic device, said device editor sub-system comprising:
   a user module selection workspace for providing selection of a plurality of pre-defined user modules of components that are selectively programmed into a target microcontroller;
   a user module placement workspace for providing a workspace for placing selected user modules from said user module selection workspace to hardware resources of said electronic device; and
   a user module pin out workspace for providing a pin out schematic display of said electronic device to allow configuration of pin selection and drive type.

2. The electronic device configuration system of claim 1, wherein said user module selection workspace further comprises a user module sub-workspace for providing a selectable catalog of user modules for selectively programming said electronic device.

3. The electronic device configuration system of claim 2, wherein said user module selection workspace further comprises a global resource sub-workspace for providing a list of global hardware settings that determine global operation of said electronic device.

4. The electronic device configuration system of claim 3, wherein said user module selection workspace further comprises a user module parameter sub-workspace for providing a list of parameters corresponding to a selected user module.

5. The electronic device configuration system client of claim 4, wherein said user module selection workspace further comprises a datasheet sub-workspace for providing datasheet information corresponding to said selected user module to facilitate user module selection.

6. The electronic device configuration system of claim 1, wherein said user module placement workspace comprises a user module placement sub-workspace for placing a selected user module with respect to available resources of said electronic device in a hardware layout graphical display.

7. The electronic device configuration system of claim 6, wherein said user module placement sub-workspace further comprises a user module selected sub-workspace for placing a color coded iconic representation of selected user modules that are placed by said user module placement workspace.

8. The electronic device configuration system of claim 7, wherein said hardware graphical layout comprises analog and digital programmable resources.

9. The electronic device configuration system of claim 1, wherein said user module pin out workspace comprises a pin out sub-workspace for viewing and editing selected pin outs parameters.

10. The electronic device configuration system of claim 9, wherein said pin out workspace further comprises a graphical chip representation sub-workspace for providing pin out parameter information for said selected pin.

11. The electronic device configuration system of claim 10, wherein said pin out workspace further comprises a global parameter display for viewing and editing global parameters.

12. A device editor system for programming a target microcontroller device, comprising:
    a user module selection workspace for providing a plurality of selectable pre-configured user modules for programming said target microcontroller device;
    a user module placement workspace for placing selected user modules of said plurality of user modules; and
    a user module pin out workspace for providing pin out parameterization for said selected user modules.

13. The device editor system of claim 12, wherein said user module selection workspace further comprises a user module sub-workspace for providing selectable catalogs of user modules for selection for programming said target microcontroller.

14. The device editor system of claim 13, wherein said user module selection workspace further comprises a global resource sub-workspace for providing a list of hardware settings that determine underlying global operation of said selected user modules.

15. The device editor system of claim 14, wherein said user module selection workspace further comprises a user module parameter sub-workspace for providing a list of parameters corresponding to a selected user modules.

16. The device editor system of claim 15, wherein said user module selection workspace further comprises a datasheet sub-workspace for providing datasheet information corresponding to a selected user modules.

17. The device editor system of claim 12, wherein said user module placement workspace comprises a hardware layout graphical display for placing said selected user modules with respect to available resources of said target microcontroller.

18. The device editor system of claim 17, wherein said user module placement sub-workspace further comprises a user module selected sub-workspace for placing a color coded iconic representation of said selected user modules that are associated with allocated resources of said hardware layout graphical display.

19. The device editor system of claim 18, wherein said user module placement sub-workspace further comprises a user module parameterization grid for displaying and editing parameters.

20. The device editor system of claim 12, wherein said user module pin out workspace comprises a pin out sub-workspace for displaying and editing pin selection and drive type parameters.

21. The device editor system of claim 20, wherein said pin out workspace further comprises a textual tabular grid of pin out parameters.

22. The device editor system of claim 21, wherein said pin out workspace further comprises a graphical chip representation sub-workspace for providing pin out parameters.

23. The device editor system of claim 22, wherein said pin out workspace provides a global bus connections pin-out selected to program said target microcontroller device.

24. A method for designing a microcontroller device using a design system having modularized user component modules defining functional components, comprising:
    providing a selection workspace for selection among a plurality of selectable user modules each pre-configured components for programming in a target microcontroller;
    providing a user module placement workspace for placing selected ones of said plurality of user modules within allowable hardware resources; and
    providing a pin out workspace for specifying pin out information placed and selected user modules.

25. The method of claim 24, wherein said providing a selection workspace comprises:
    high-lighting a desired user module from said plurality of user modules, and
    high-lighting subsequent selections of said user module until a desired number of user modules have been selected.

26. The method of claim 24, further comprising checking a user module data workspace to determine the data characteristics of said selected user modules.

27. The method of claims 24, wherein said providing a user module placement workspace further comprises color coding selected ones of said plurality of user modules that are place in said user module placement workspace.

28. The method of claim 27, further comprising providing a schematic representation of selected user modules in said user module selection workspace.

29. The method of claim 28, further comprising providing a resource management workspace for monitoring resource usage of said selected user modules.

30. The method of claims 24, wherein said providing said pin out workspace comprises selecting a target numbered pin from a plurality of available pins to display and alter pin parameters in the microcontroller design.

31. The method of claim 27, wherein said providing a user module placement workspace comprises providing a graphical layout block comprising analog and digital peripheral blocks of said target microcontroller device that are customized by the placement and configuration of said user modules.

32. The method of claim 30, further comprising high-lighting available options of pin out parameters for said selected numbered pin to allow the configuration of said pin's drive characteristics.

33. A method for designing a system on a chip comprising: a) selecting a user module from a series of catalogs of user module types found in a user module selection workspace, wherein said selecting causes display of datasheet information regarding said selected user module; b) placing said user module within a graphical representation of a hardware resource of a programmable circuit and using a user module placement workspace comprising a graphical layout of hardware resources of said programmable circuit; and c) viewing and editing pin-out parameterization information using a user module pin-out workspace.

34. A method as described in claim 33, wherein said selecting also causes updating of cumulative bar charts displaying hardware resource usage and wherein said user module selection workspace comprises said cumulative bar charts.

35. A method as described in claim 33, further comprising displaying and editing user module parameterization information using a user module parameterization window of said user module selection workspace.

36. A method as described in claim 33, further comprising displaying and editing global parameterization information using a global parameterization window of said user module placement workspace.

37. A method as described in claim 33, wherein said user module placement workspace comprises a user module bar containing icons of selected user modules and wherein said placing comprises color coding icons and related allocated hardware graphical representations of said graphical layout.

38. A method as described in claim 33, wherein said viewing and editing pin-out parameterization comprises viewing and editing pin selection and pin drive type information.

39. A method as described in claim 38, wherein said user module pin-out workspace comprises: a textual tabular grid for displaying and editing pin-out parameterization information; and a graphical representation of a chip having external pins for displaying and editing pin-out parameterization information.

* * * * *